(12) United States Patent
Wu et al.

(10) Patent No.: US 11,539,150 B2
(45) Date of Patent: Dec. 27, 2022

(54) PIN, PIN COMBINATION STRUCTURE, PACKAGE BODY, AND METHOD FOR MANUFACTURING PACKAGE BODY

(71) Applicant: HUAWEI TECHNOLOGIES CO., LTD., Guangdong (CN)

(72) Inventors: Hong Wu, Shanghai (CN); Zhen Lv, Shanghai (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 9 days.

(21) Appl. No.: 17/135,736

(22) Filed: Dec. 28, 2020

(65) Prior Publication Data

US 2021/0119358 A1    Apr. 22, 2021

Related U.S. Application Data

(63) Continuation of application No. PCT/CN2019/086735, filed on May 14, 2019.

(30) Foreign Application Priority Data

Nov. 19, 2018 (CN) .......................... 201811376365.9

(51) Int. Cl.
| | | |
|---|---|---|
| *H01R 12/58* | (2011.01) | |
| *H01R 12/70* | (2011.01) | |
| *H01R 43/02* | (2006.01) | |
| *H01R 43/24* | (2006.01) | |

(52) U.S. Cl.
CPC ........... *H01R 12/58* (2013.01); *H01R 12/707* (2013.01); *H01R 43/0256* (2013.01); *H01R 43/24* (2013.01)

(58) Field of Classification Search
CPC .. H01R 12/58; H01R 12/707; H01R 43/0256; H01R 43/24; H01L 21/565; H01L 23/49811
See application file for complete search history.

(56) References Cited

U.S. PATENT DOCUMENTS

| | | | |
|---|---|---|---|
| 5,473,189 A | 12/1995 | Nakanishi | |
| 5,518,427 A | 5/1996 | Kan et al. | |
| 7,045,730 B2* | 5/2006 | Hollar | .................... H02B 1/063 439/535 |
| 9,263,820 B2 | 2/2016 | Mattiuzzo | |
| 11,133,609 B2* | 9/2021 | Hinata | ................ H01L 21/4853 |
| 2009/0085189 A1* | 4/2009 | Thoben | ................. H01L 25/072 438/106 |

(Continued)

FOREIGN PATENT DOCUMENTS

| | | |
|---|---|---|
| CN | 203134775 U | 8/2013 |
| CN | 203433975 U | 2/2014 |

(Continued)

*Primary Examiner* — Truc T Nguyen
(74) *Attorney, Agent, or Firm* — Womble Bond Dickinson (US) LLP

(57) ABSTRACT

Methods and apparatuses to provide a pin, a pin combination structure and a package body are described. A baffle structure is sleeved on the pin. The baffle structure is used to prevent a plastic packaging material from overflowing from a cavity that accommodates the plastic packaging material. The cavity is in a mold for packaging the package body.

15 Claims, 5 Drawing Sheets

(56) References Cited

U.S. PATENT DOCUMENTS

| | | | |
|---|---|---|---|
| 2012/0186864 A1* | 7/2012 | Inoue | B23K 1/00 |
| | | | 174/258 |
| 2016/0240452 A1 | 8/2016 | Prajuckamol et al. | |
| 2017/0236782 A1 | 8/2017 | Nonaka | |
| 2018/0190554 A1* | 7/2018 | Adachi | H01R 12/585 |
| 2019/0189529 A1* | 6/2019 | Nishida | H01L 23/08 |

FOREIGN PATENT DOCUMENTS

| | | |
|---|---|---|
| CN | 104158485 A | 11/2014 |
| CN | 104832888 A | 8/2015 |
| CN | 105074919 A | 11/2015 |
| CN | 205863162 U | 1/2017 |
| CN | 106910692 A | 6/2017 |
| CN | 206349396 U | 7/2017 |
| CN | 107086183 A | 8/2017 |
| CN | 109727947 A | 5/2019 |
| EP | 2086064 A1 | 8/2009 |
| JP | S63158858 A | 7/1988 |
| JP | 2009059812 A | 3/2009 |
| KR | 100692430 B1 | 3/2007 |
| WO | 2016185920 A1 | 11/2016 |

* cited by examiner

PIN, PIN COMBINATION STRUCTURE, PACKAGE BODY, AND METHOD FOR MANUFACTURING PACKAGE BODY

CROSS-REFERENCE TO RELATED APPLICATIONS

This application is a continuation of International Application No. PCT/CN2019/086735, filed on May 14, 2019, which claims priority to Chinese Patent Application No. 201811376365.9, filed on Nov. 19, 2018. The disclosures of the aforementioned applications are hereby incorporated by reference in their entireties.

TECHNICAL FIELD

The application relates to the field of electronic packaging, and in particular, to a pin, a pin combination structure, a package body, and a method for manufacturing a package body.

BACKGROUND

Highly integrated modules such as chips and power modules are widely used. A module packaging manner may vary with different module types, packaging materials, connection manners, and the like. For example, housing packaging may be performing glue filling after a bottom structure of a pin is soldered to a substrate and placed into a plastic housing or is inserted into a thermoplastic part of a housing. A top structure of the pin may be crimped or soldered to a printed circuit board (PCB) connected to the pin.

Usually, after the bottom structure of the pin is soldered to the substrate, the pin is provided with the housing. There is a cavity in the housing. The bottom structure of the pin is soldered or crimped to the substrate. The top structure of the pin extends out of the housing through a slot on the housing. Then, glue filling is performed. A silicone gel may be filled into the housing. The silicone gel functions to implement insulation, dust isolation, and the like for a soldering part between the pin and the substrate. Alternatively, molding packaging may be used. After a bottom of a pin is soldered to a substrate, which is then placed into a mold having a cavity, a plastic packaging material is filled into the cavity. After the plastic packaging material is solidified, a package body may be obtained.

Therefore, when the plastic packaging material is filled, since the pin is connected to the housing or the mold in a clamping manner, the connection is not tight enough, which easily causes problems such as overflow of the filled plastic packaging material such as the silicone gel or epoxy resin, overflow of the gel, and contamination of the mold or the pin.

SUMMARY

The application provides a pin, a pin combination structure, a package body, and a method for manufacturing a package body. A cover plate or a skirt structure is sleeved on the pin, to prevent, when a plastic packaging material is filled, the plastic packaging material from overflowing from a cavity that accommodates the plastic packaging material and that is in a mold for packaging the package body.

In an embodiment, the application provides a pin. The pin is applied to a package body, the package body includes the pin, a substrate, and a plastic packaging material, and the pin includes a body and a baffle structure. A bottom of the body of the pin is soldered to the substrate, the baffle structure is sleeved on a middle of the body, and the plastic packaging material covers the substrate and wraps a bottom-to-middle part of the body. The baffle structure is configured to prevent the plastic packaging material from overflowing from a cavity when the liquefied plastic packaging material is filled into the cavity, the cavity is a cavity that accommodates the plastic packaging material and that is in a mold for packaging the package body, the cavity accommodates the bottom-to-middle part of the body and the substrate, the substrate is located at a bottom of the cavity, the middle of the body is located at a top of the cavity, a side wall at the top of the cavity abuts against the baffle structure of the body, and a bottom-to-top height of the cavity is lower than a bottom-to-top height of the body.

In an embodiment of the application, the middle of the pin is sleeved with the baffle structure, so that when the plastic packaging material is filled, the plastic packaging material can be prevented from overflowing from the cavity that accommodates the plastic packaging material and that is in the mold for packaging the package body. This avoids contamination of the mold and the pin.

In an embodiment, an angle between the baffle structure and the body along a direction of the bottom of the body is greater than 0 degrees, and is less than or equal to 90 degrees. It may be understood that the baffle structure may be a cover plate structure, or may be a skirt structure.

In an embodiment, the baffle structure is made of a material capable of resisting a high temperature of over 175 degrees Celsius. When plastic packaging is performed on the package body, the plastic packaging material is liquefied at a high temperature. Therefore, when the plastic packaging material is filled, the plastic packaging material is in a high-temperature state. To avoid damage to the baffle structure, the baffle structure may be made of a high-temperature-resistant material.

In an embodiment, the baffle structure is made of an elastic material. Because the baffle structure abuts against the top of the cavity of the mold, if the baffle structure is made of an elastic material, better sealing performance can be achieved between the baffle structure and the mold.

In an embodiment, the baffle structure and the middle of the body are integrally formed.

In an embodiment of the application, the baffle structure and the middle of the body may be integrally formed, so that the baffle structure and the middle of the body can be combined more tightly. This further avoids overflow of the plastic packaging material.

In an embodiment, a platform structure is further disposed between the middle and the bottom of the body, and a width of an end that is of the platform structure and that faces the middle of the body is greater than a width of the middle of the body. During mold clamping, the platform structure can bear pressure exerted by the mold on the pin.

In an embodiment, a curved structure is further included between the middle and the bottom of the body, and a slot is disposed in the curved structure. The curved structure increases an area of contact with the plastic packaging material through the curved shape and the slot. This enhances combination with the plastic packaging material.

In an embodiment, a flat connection structure is further disposed between the middle of the body and the top of the body.

A thickness of the connection structure is less than a threshold. Alternatively, the connection structure is a rhombus structure, a slot is disposed in the connection structure, one of corners of the rhombus structure is connected to the top of the body, and an opposite corner is connected to the middle of the body.

It may be understood that the connection structure may be the flat structure, and the thickness of the connection structure may be relatively thin, so that excessive pressure can be absorbed when the pin is crimped. This avoids damage to the pin. Alternatively, the connection structure may be the rhombus structure, the slot is disposed in the connection structure, one of the corners of the rhombus structure is connected to the top of the body, and an opposite corner is connected to the middle of the body, so that the connection structure can bear pressure generated when the pin is crimped. This avoids damage to the pin.

In an embodiment, the bottom of the body is a bottom plate of a plate-shaped structure, and the bottom plate is soldered to the substrate. The bottom of the pin is plate-shaped, so that an area of soldering with the substrate can be increased. This improves soldering stability of the pin.

In an embodiment, the application provides a pin combination structure. The pin combination structure is applied to a package body, the package body includes the pin, a substrate, and a plastic packaging material, and the pin combination structure includes at least two pins and a baffle structure. A bottom of each of the at least two pins is soldered to the substrate, and the plastic packaging material covers the substrate and wraps a bottom-to-middle part of each pin. At least two slots are provided on the baffle structure, each of the at least two slots of the baffle structure is sleeved on a middle of each pin, and the at least two slots are in a one-to-one correspondence with the at least two pins. The baffle structure is configured to prevent the plastic packaging material from overflowing from a cavity when the plastic packaging material is filled into the cavity, the cavity is a cavity that accommodates the plastic packaging material and that is in a mold for packaging the package body, the cavity accommodates bottom-to-middle parts of the at least two pins and the substrate, the substrate is located at a bottom of the cavity, middles of the at least two pins are located at a top of the cavity, a side wall at the top of the cavity abuts against the baffle structure, and a bottom-to-top height of the cavity is lower than a bottom-to-top height of the substrate and a body.

In an embodiment of the application, the middle of the pin is sleeved with the baffle structure, and the baffle structure may be sleeved on a plurality of pins, so that when the plastic packaging material is filled, the plastic packaging material can be prevented from overflowing from the cavity that accommodates the plastic packaging material and that is in the mold for packaging the package body. This avoids contamination of the mold and the pin.

In an embodiment, the application provides a package body, including: a substrate, a plastic packaging material, a pin, and a baffle structure sleeved on the pin. A bottom of a body of the pin is soldered to the substrate, the baffle structure is sleeved on a middle of the body, and the plastic packaging material covers the substrate and wraps a bottom-to-middle part of the body. The baffle structure is configured to prevent the plastic packaging material from overflowing from a cavity when the plastic packaging material is filled into the cavity, the cavity is a cavity that accommodates the plastic packaging material and that is in a mold for packaging the package body, the cavity accommodates the bottom-to-middle part of the body and the substrate, the substrate is located at a bottom of the cavity, the middle of the body is located at a top of the cavity, a side wall at the top of the cavity abuts against the baffle structure of the body, and a bottom-to-top height of the cavity is lower than a bottom-to-top height of the body.

In an embodiment of the application, the package body may include the substrate, the pin soldered to the substrate, and the plastic packaging material that covers the substrate and the bottom-to-middle part of the pin, and the pin is further sleeved with the baffle structure. Therefore, when the plastic packaging material is filled, the baffle structure can prevent the plastic packaging material from overflowing from the cavity that accommodates the plastic packaging material and that is in the mold for packaging the package body. This avoids contamination of the mold and the pin.

In an embodiment, an angle between the baffle structure and the pin along a direction of the bottom of the pin is greater than 0 degrees, and is less than or equal to 90 degrees.

In an embodiment, the baffle structure is made of a material capable of resisting a high temperature of over 175 degrees Celsius.

In an embodiment, the baffle structure is made of an elastic material.

In an embodiment, the baffle structure and the middle of the body are integrally formed. The baffle structure and the middle of the body may be integrally formed, so that the baffle structure and the middle of the body can be combined more tightly. This further avoids overflow of the plastic packaging material.

In an embodiment, a platform structure is further disposed between the middle and the bottom of the pin, and a width of an end that is of the platform structure and that faces the middle of the body is greater than a width of the middle of the body. During mold clamping, the platform structure can bear pressure exerted by the mold on the pin.

In an embodiment, a curved structure is further included between the middle and the bottom of the pin, and a slot is disposed in the curved structure. The curved structure increases an area of contact with the plastic packaging material through the curved shape and the slot. This enhances combination with the plastic packaging material.

In an embodiment, a flat connection structure is further disposed between the middle of the pin and the top of the pin.

A thickness of the connection structure is less than a threshold. Alternatively, the connection structure is a rhombus structure, a slot is disposed in the connection structure, one of corners of the rhombus structure is connected to the top of the body, and an opposite corner is connected to the middle of the pin.

It may be understood that the connection structure may be the flat structure, and the thickness of the connection structure may be relatively thin, so that excessive pressure can be absorbed when the pin is crimped. This avoids damage to the pin. Alternatively, the connection structure may be the rhombus structure, the slot is disposed in the connection structure, one of the corners of the rhombus structure is connected to the top of the body, and an opposite corner is connected to the middle of the body, so that the connection structure can bear pressure generated when the pin is crimped. This avoids damage to the pin.

In an embodiment, the bottom of the pin is a bottom plate of a plate-shaped structure, and the bottom plate is soldered to the substrate. The bottom of the pin is plate-shaped, so that an area of soldering with the substrate can be increased. This improves soldering stability of the pin.

In an embodiment, the application provides a method for manufacturing a package body, including: soldering a bottom of at least one pin to a substrate; placing the substrate to which the at least one pin is soldered into a mold, where a cavity that accommodates the substrate to a middle of the at least one pin is disposed inside the mold, each of the at least one pin is sleeved with a baffle structure, a side wall at a top of the cavity abuts against the baffle structure, and the baffle structure is configured to prevent a plastic packaging material from overflowing from the cavity; and filling the liquefied plastic packaging material into the cavity, so that the package body is obtained after the liquefied plastic packaging material is solidified. Therefore, in an embodiment of the application, after the bottom of the pin is soldered to the substrate, the substrate is placed into the mold. The cavity inside the mold may accommodate the substrate and a bottom-to-middle part of the pin. The substrate is located at a bottom of the cavity, a middle of the body is located at a top of the cavity, a bottom-to-top height of the cavity is lower than a bottom-to-top height of the substrate and the body, and the middle of the pin is sleeved with the baffle structure. When the plastic packaging material is filled, the baffle structure can prevent the plastic packaging material from overflowing from the cavity. This avoids contamination of the mold and the pin.

In at least one embodiment of the application, the pin may be applied to the package body, the package body includes the pin, the substrate, and the plastic packaging material, the plastic packaging material covers the substrate and the bottom-to-middle part of the pin, and the middle of the pin is sleeved with the baffle structure. When the plastic packaging material is filled, the plastic packaging material can be prevented from overflowing from the cavity that accommodates the plastic packaging material and that is in the mold for packaging the package body. This avoids contamination of the mold and the pin.

DESCRIPTION OF EMBODIMENTS

Figure 1:
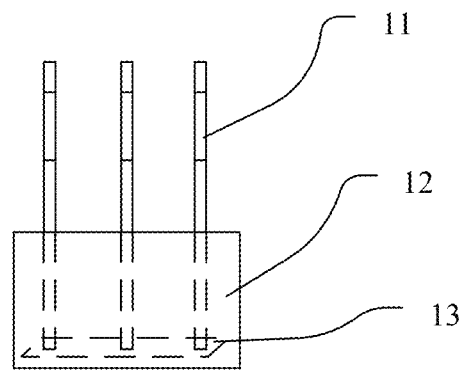
FIG. 1 is a schematic structural diagram of a package body according to an embodiment of the application.

The application provides a pin, a pin combination structure, a package body, and a method for manufacturing a package body. A cover plate or a skirt structure is sleeved on the pin, to prevent, when a plastic packaging material is filled, the plastic packaging material from overflowing from a cavity that accommodates the plastic packaging material and that is in a mold for packaging the package body.

Common packaging manners include molding packaging, housing packaging, and the like. The molding packaging is generally adhering a component to a leadframe or/and a substrate, and then performing glue filling so that a plastic packaging material covers the substrate and the frame, where a pin is a part of the leadframe. During application, the pin is soldered to a printed circuit board (PCB), to implement connection to the PCB. Such pins are generally located around a plastic package body. If it is necessary to lead out a pin from a front or rear surface of the plastic package body, space needs to be reserved on the surface of the plastic package body to expose the frame, and a hole needs to be reserved on the leadframe to connect a specially designed pin to the leadframe, to implement electrical connection to the inside. Therefore, in such a crimped plastic package body, a pin can be crimped only at a position having a frame, and a position for leading out a pin is affected by the frame. Therefore, a position of the pin cannot be flexibly determined. In addition, it is relatively complex during manufacturing to reserve space at a position at which the package body is connected to the pin, and production is difficult to implement. The housing packaging manner may be filling a silicone gel into a plastic housing after soldering a pin to a substrate and placing them into the plastic housing or after inserting the pin into the plastic housing, so that the pin is led out from a surface. The pin may be crimped or soldered. However, the silicone gel is not reliable and barely isolates water vapor. If plastic packaging is performed in a manner similar to the "housing", that is, a pin is soldered to a substrate and then the pin and the substrate after the soldering are placed into a mold, the mold may include a cavity that accommodates a plastic packaging material. The liquefied plastic packaging material is filled into the cavity. After the plastic packaging material is solidified, a package body may be obtained. However, when the plastic packaging material is filled, the pin only abuts against the mold or the plastic housing, and the plastic packaging material cannot be sealed. In addition, when the plastic packaging material is filled, since the plastic packaging material is in a liquid form, the plastic packaging material may leak. Therefore, to avoid leakage of the plastic packaging material, in the application, a baffle structure is added to the pin, to avoid leakage of the plastic packaging material caused when the plastic packaging material is filled.

First, a pin provided in an embodiment of the application may be applied to a package body. The package body may be a module having a pin, e.g., a power module or a chip module.

For example, for a schematic diagram of a package body provided in an embodiment of the application, refer to FIG. 1.

The package body may include a pin 11, a plastic packaging material 12, and a substrate 13. In addition, the package body further includes a baffle structure (not shown) sleeved on the pin 11.

A bottom of the pin 11 is soldered to the substrate 13. The plastic packaging material 12 covers the substrate 13, and wraps a bottom-to-middle part of the pin 11.

Figure 2:
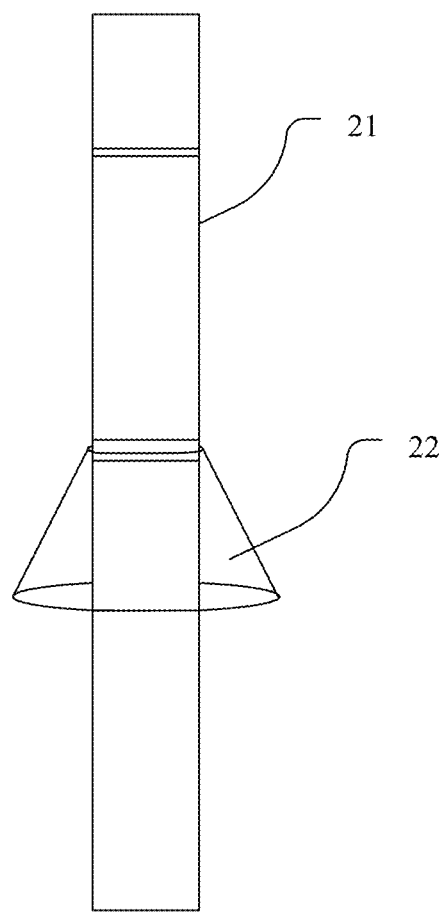
FIG. 2 is a schematic structural diagram of a pin according to an embodiment of the application.

A schematic diagram of the pin and the baffle structure provided in an embodiment of the application may be shown in FIG. 2. The pin may include a pin body 21 and a baffle structure 22.

The baffle structure 22 is sleeved on a middle of the body 21. It may be understood that a slot is provided in the baffle structure 22, the body 21 passes through the slot, and the middle of the body 21 abuts against an edge of the slot. Alternatively, the baffle structure 22 and the body 21 may be integrally formed.

It should be understood that the middle of the body 21 in an embodiment of the application is a part between a bottom and a top of the body 21. In other words, the middle of the body 21 may be a center of the body 21, or may be a part below the top and above the bottom.

When the plastic packaging material is filled, a cavity that accommodates the substrate and the bottom-to-middle part of the pin is disposed in a mold. The substrate is located at a bottom of the cavity, the middle of the body is located at a top of the cavity, and a bottom-to-top height of the cavity is lower than a height from the substrate to the top of the body. The baffle structure 22 may abut against a side wall at the top of the cavity in the mold. Therefore, a sealing effect may be achieved at a contact part between the mold and the pin 21, to prevent the plastic packaging material from overflowing from the cavity of the mold along the middle of the body 21.

Optionally, the plastic packaging material in an embodiment of the application may include epoxy resin, and can implement functions e.g., insulation and dust isolation. In addition, reliability of the plastic packaging material is relatively high, and may be higher than that of a silicone gel or the like.

Therefore, in an embodiment of the application, when the plastic packaging material is filled, the baffle structure 22 can prevent the plastic packaging material from overflowing from the cavity of the mold along the body 21. This avoids contamination of the mold or the pin or the like caused by the plastic packaging material.

In an embodiment of the application, a pin is a crimped pin, as described in further detail below. A pin provided in an embodiment of the application may be shown in FIG. 3. A pin body may include a top 210, a connection structure 211, a middle 212, a platform structure 213, a curved structure 214, and a bottom 215.

The top 210, the connection structure 211, the middle 212, the platform structure 213, the curved structure 214, and the bottom 215 are integrally formed. The connection structure 211, the platform structure 213, and the curved structure 214 are optional structures.

The top 210 is a flat crimped head with arcs on both sides, and is provided with a slot of a fisheye structure. In this way, the crimped pin can be in full contact with a PCB, to release stress and more stably connect to the PCB.

Optionally, the connection structure 211 may be a flat square, and a thickness of the connection structure 211 may be less than a threshold. The threshold may be 1 mm, 0.5 mm, or the like, and may be adjusted based on an actual application scenario. It may be understood that the thickness of the connection structure 211 may be set to be relatively low, so that when a relatively large external force is received, for example, when the pin is crimped to the PCB with an excessively large force, the connection structure 211 may absorb the relatively large external force, to avoid a problem that a part below the connection structure 211 of the body is deformed due to the relatively large external force, and consequently a package body cannot be used.

The middle 212 may be a flat square structure, and is sleeved with a baffle structure 22.

Optionally, an angle between the baffle structure 22 and the middle 212 along a direction of the bottom 215 is 0 to 90 degrees, and may be 30 degrees, 45 degrees, 60 degrees, or the like. When the angle between the baffle structure and the middle 212 along the direction of the bottom 215 is less than 90 degrees, it may be understood that the baffle structure 22 is a skirt structure. When the angle between the baffle structure and the middle 212 along the direction of the bottom 215 is 90 degrees, it may be understood that the baffle structure 22 is a cover plate structure.

Optionally, the baffle structure 22 is made of an elastic material. In other words, the baffle structure 22 is elastic. The elastic material may be, for example, silicone, plastic, or polypropylene (PP). Therefore, when a plastic packaging material is filled, when the baffle structure 22 abuts against a side wall at a top of a cavity in a mold, the baffle structure 22 may elastically abut against the mold more tightly, to avoid overflow of the plastic packaging material from the cavity of the mold.

Optionally, the baffle structure 22 is made of a material capable of resisting a high temperature. The material may be a material capable of resisting a high temperature of over 175 degrees Celsius, for example, a PP (polypropylene) material or polyvinyl chloride (PVC). Generally, when the plastic packaging material is liquefied, the plastic packaging material is melted to a liquid form at a high temperature. Therefore, the baffle structure 22 capable of resisting a high temperature can avoid damage caused because the filled plastic packaging material is a high-temperature material, and further abut against the mold more tightly, to avoid overflow of the plastic packaging material.

Optionally, the baffle structure 22 and the body 21 may be separate structures, or may be integrally formed. When the baffle structure 22 and the body 21 may be separate structures, the baffle structure 22 needs to be sleeved on the body 21, and a position at which the baffle structure is sleeved on the body may be adjusted in real time, to adapt to molds with different cavity heights. When the baffle structure 22 and the body 21 are integrally formed, the baffle structure may be fastened to the middle of the body when the body 21 is obtained, so that a joint between the body and the baffle structure is more tightly sealed, and an operation of disposing the baffle structure can be saved, to simplify a process of manufacturing the package body.

Optionally, the platform structure 213 is below the middle 212, and a width of the platform structure is greater than a width of the middle 212. In addition, when the baffle structure 22 is a skirt structure, an edge that is of the platform structure 213 and that is along a direction of the middle 212 abuts against a skirt edge of the baffle structure 22, to provide support for the baffle structure 22. In addition, combination with the middle structure 212 may be enhanced, to bear pressure for the middle structure 212 during mold clamping. The mold clamping means that before the plastic packaging material is filled, the substrate and the pin are placed into the cavity of the mold so that the mold abuts against the baffle structure sleeved on the middle of the body 21 and a sealed cavity is formed in the cavity of the mold and below the middle of the body 21, and then the plastic packaging material is filled. It may alternatively be understood that a boss that transversely protrudes relative to the body is further disposed between the middle and the bottom of the body. When the angle between the baffle structure and the body along the direction of the bottom of the body is less than 90 degrees, the boss may further abut against an edge of the baffle structure, to support the baffle structure and prevent the baffle structure from falling off.

Optionally, a curved structure 214 is further included below the middle structure 212, and a slot is provided in the curved structure 214, to increase an area of contact between the pin and the plastic packaging material and enhance combination between the pin and the plastic packaging material.

Optionally, the bottom 215 may be a square or another flat structure with a specific thickness, and may be soldered to the substrate.

Figure 4:
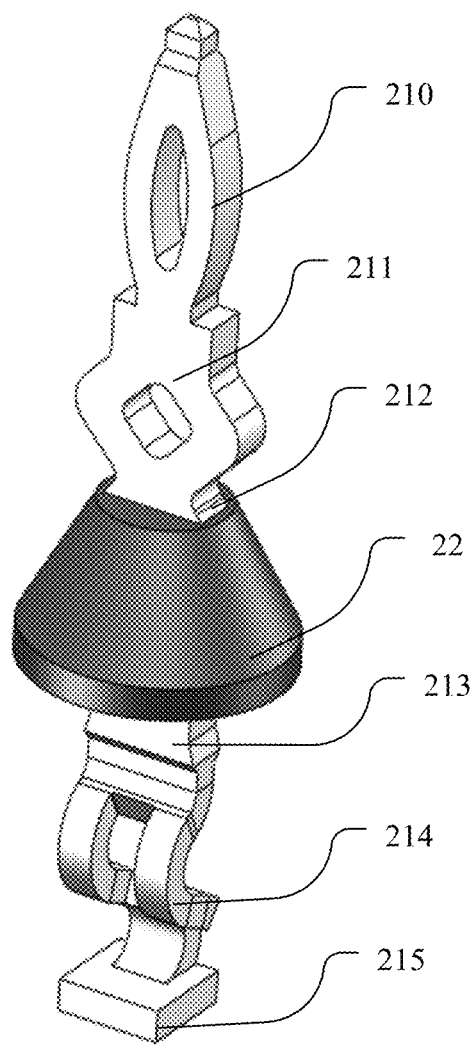
FIG. 4 is a schematic structural diagram of another pin according to an embodiment of the application.

Optionally, the connection structure 211 may alternatively be another structure, for example, a rhombus structure shown in FIG. 4. One of corners of the rhombic structure is connected to the top structure 210, and an opposite corner is connected to the middle 212. The connection structure 211 may be configured to bear stress during crimping, to enhance overall strength of the pin, avoid deformation and damage of the pin caused by a relatively large external force, and further avoid unavailability of the package body caused by damage of the pin.

Therefore, in an embodiment of the application, the baffle structure may be sleeved on the body of the pin, so that when the plastic packaging material is filled, the mold for packaging can be tightly combined with the pin, to prevent the plastic packaging material from overflowing from the cavity that accommodates the plastic packaging material and that is in the mold, and avoid leakage of the plastic packaging material during mold clamping. This avoids contamination of the mold or above the middle of the pin, and further avoiding unavailability of the package body caused by contamination of the pin. Therefore, sealing performance and reliability of the packaging are ensured. In addition, the pin can be flexibly led out from a top of the package body. Compared with packaging in which a surface is provided with a hole and a pin is connected to a leadframe, the pin provided in an embodiment of the application can be flexibly led out, and the pin is directly connected to the substrate, so that a parasitic parameter is small. This improves manufacturing efficiency of the package body.

The foregoing describes in detail the pin provided in embodiments of the application. In addition to the foregoing case shown in FIG. 2 to FIG. 4 in which one pin corresponds to one baffle structure, a plurality of pins may correspond to one baffle structure. The "plurality of pins" means two or more than two pins, which may be understood as a pin combination structure provided in the application. A pin structure in the pin combination structure is similar to the pin structures in FIG. 2 to FIG. 4, and a difference lies in that the plurality of pins share one baffle structure. A specific structure of a pin is not described herein again. For example, FIG. 5 is a schematic diagram of an embodiment of a pin combination structure according to the application.

Figure 5:
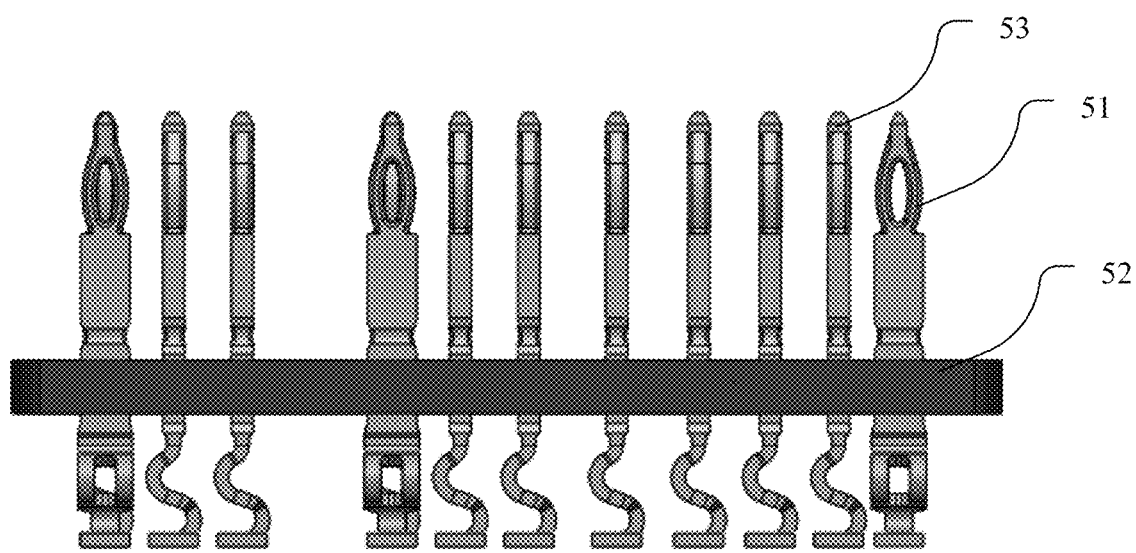
FIG. 5 is a schematic structural diagram of a pin combination structure according to an embodiment of the application.

As shown in FIG. 5, the pin combination structure may include at least two pins a body 51 and a body 53, and a baffle structure 52 sleeved on the at least two pins.

The pin body may have different structures. In addition to the structures shown in FIG. 3 and FIG. 4, the pin body may have a needle structure, as shown by the body 53 in FIG. 5. This is not limited in an embodiment of the application.

As shown in FIG. 5, the baffle structure 52 may be a cover plate structure, or may be a skirt structure. In other words, an angle between the baffle structure 52 and the body 51 or the body 53 along a direction of a bottom of the body may be 0 to 90 degrees.

A plurality of slots may be provided in the baffle structure, each slot corresponds to one pin body, each pin body passes through a corresponding slot, and a middle of each pin body abuts against an edge of the corresponding slot.

Figure 3:
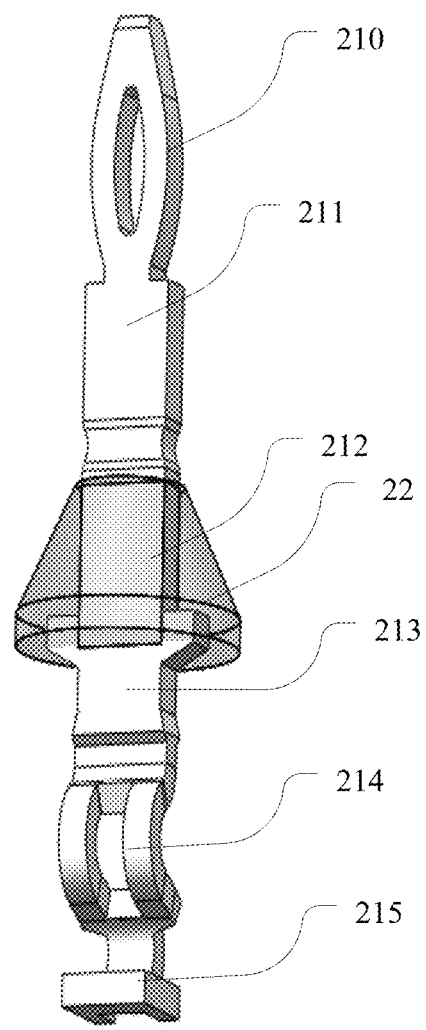
FIG. 3 is a schematic structural diagram of another pin according to an embodiment of the application.

In addition, the pin combination structure may also be applied to a package body, which is similar to the manner in which the pins provided in FIG. 3 and FIG. 4 are applied to a package body. A bottom of each pin is soldered or crimped to a substrate, which is then placed into a mold. Moreover, the substrate and a part that is of each pin and that is located below the baffle structure, namely, a bottom-to-middle part of each pin, are located in a cavity of the mold, the substrate is located at a bottom of the cavity, middles of the at least two pins are located at a top of the cavity, and a bottom-to-top height of the cavity is lower than a height from the substrate to a top of the body, or the bottom-to-top height of the cavity is lower than a bottom-to-top height of the body. The cavity of the mold is filled with a liquefied plastic packaging material. After the plastic packaging material is solidified, the package body may be obtained.

In an embodiment of the application, the plurality of pins may share one baffle structure, and the baffle structure may be used to prevent the plastic packaging material from overflowing from the cavity that accommodates the plastic packaging material and that is in the mold when the plastic packaging material is filled. This avoids contamination of the pins and the mold caused by overflow of the plastic packaging material. Therefore, the pin combination structure provided in an embodiment of the application can avoid leakage of the plastic packaging material during mold clamping. This avoids contamination of the mold or above a middle of a pin, and further avoiding unavailability of the package body caused by contamination of the pin, and improving sealing performance and reliability of packaging. In addition, the pins can be flexibly led out from a top/surface of the package body. Compared with packaging in which a surface is provided with a hole and a pin is connected to a frame, the pins provided in an embodiment of the application can be flexibly led out, and the pins are directly connected to the substrate, so that a parasitic parameter is small. This improves manufacturing efficiency of the package body.

The foregoing describes in detail the pin and the pin combination structure that are provided in embodiments of the application. In an embodiment of the application, the pin and the pin combination structure may be applied to the package body shown in FIG. 1. In the package body, the pin is soldered to the substrate, and the pin includes the baffle structure sleeved on the middle. Therefore, when the package body is manufactured and the plastic packaging material is filled, the baffle structure can prevent the plastic packaging material from overflowing from the cavity that accommodates the plastic packaging material and that is in the mold, and avoid contamination of the pin and the mold caused by overflow of the plastic packaging material, to obtain a more reliable package body. In addition, the pin is led out from a top of the package body in an embodiment of the application. Compared with packaging in which a pin is led out from a side surface, or a surface is provided with a hole and a pin is connected to a frame, the pin is directly connected to the substrate, so that a parasitic parameter of the package body can be reduced, a size of the package body can be reduced, and efficiency of manufacturing the package body can be improved.

Figure 6:
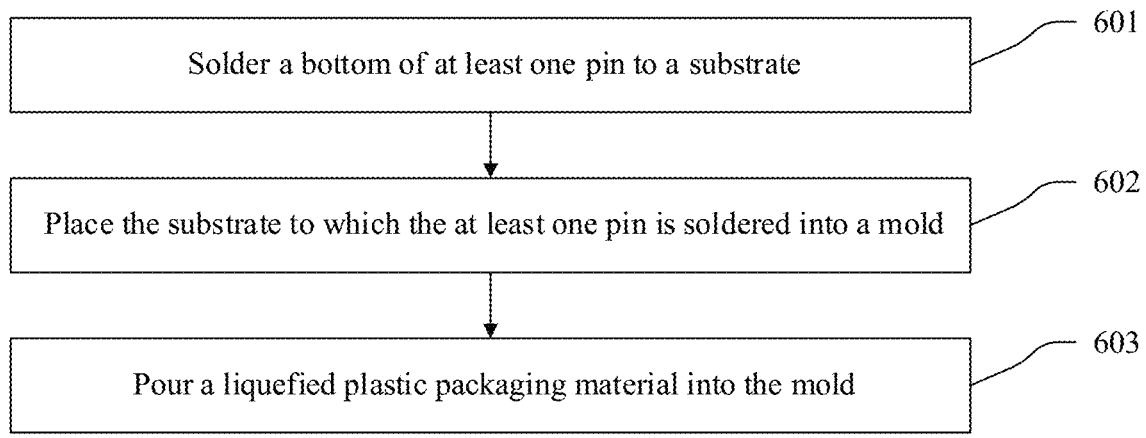
FIG. 6 is a schematic flowchart of a method for manufacturing a package body according to an embodiment of the application.

The foregoing describes in detail the package body and the pin structure in the package body that are provided in embodiments of the application. Based on the pin, the pin combination structure, and the package body, an embodiment of the application further provides a method for manufacturing a package body. FIG. 6 is a schematic flowchart of a method for manufacturing a package body according to an embodiment of the application. The method may include the following operations.

601. Solder a bottom of at least one pin to a substrate.

First, after at least one pin sleeved with a baffle structure is obtained, a bottom of the pin is soldered to a substrate.

In an embodiment of the application, the pin is preferably led out from a top of a package body, that is, the bottom of the pin is soldered to the substrate, and a body of the pin may be perpendicular to the substrate, so that a parasitic parameter of the package body can be reduced.

The body of the pin and the baffle structure may be formed separately, or may be integrally formed. When the body of the pin and the baffle structure are formed separately, the baffle structure further needs to be sleeved on the pin body. After a complete pin is obtained, the complete pin is soldered to the substrate. If the body of the pin and the baffle structure are integrally formed, the at least one pin may be directly soldered to the substrate. The at least one pin may further include a pin combination structure. The pin combination structure means that a plurality of pins share one baffle structure to form the pin combination structure, and a bottom of each pin in the pin combination structure is soldered to the substrate.

Figure 7:
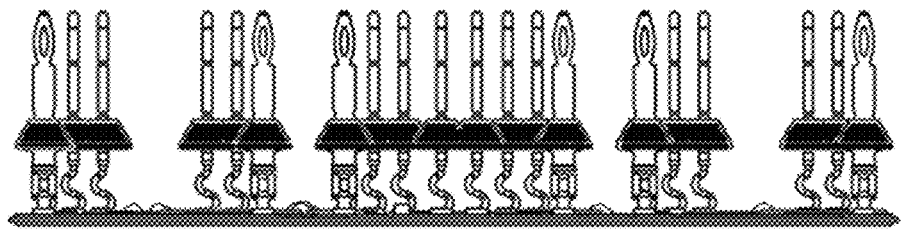
FIG. 7 is a schematic structural diagram of a substrate to which a pin is soldered according to an embodiment of the application.

Generally, in an actual application, the pin needs to be generated first, which includes stamping molding of a body structure and injection molding of the baffle structure, or the baffle structure is independently manufactured and then sleeved on a middle of the body. Then, the pin is soldered or a chip is soldered, and the like. As shown in FIG. 3 and FIG. 4, the bottom of the pin may be a square or another flat structure with a specific thickness, and the bottom of the pin may be soldered to the substrate. For example, the substrate after the soldering is completed may be shown in FIG. 7. In addition to the pin, another electronic component e.g., the chip or a transistor may be soldered to the substrate.

602. Place the substrate to which the at least one pin is soldered into a mold.

After the at least one pin is soldered to the substrate, the substrate to which the at least one pin is soldered is placed into the mold.

Figure 8:
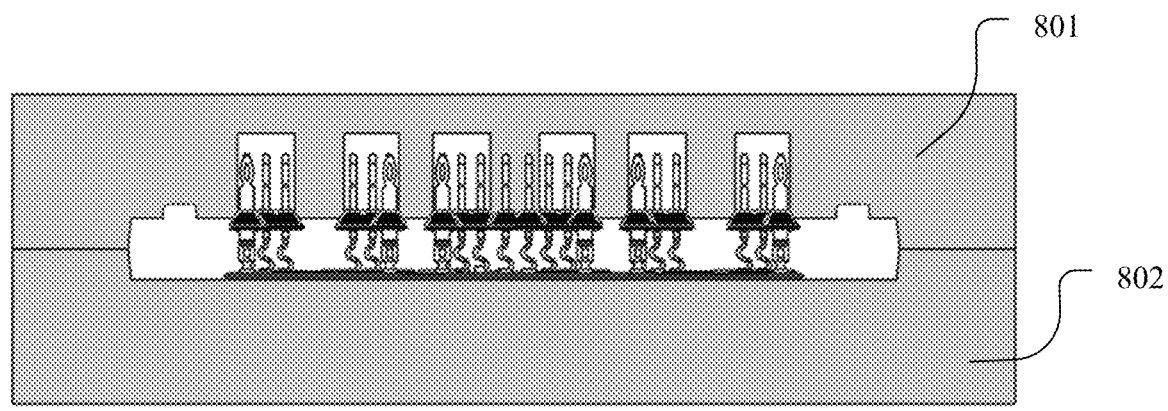
FIG. 8 is a schematic structural diagram after a substrate is placed into a mold according to an embodiment of the application.

For example, the mold and the substrate may be shown in FIG. 8. The mold has a first cavity and at least one second cavity. The first cavity is the cavity that is described above in the application and that accommodates the substrate and the bottom-to-middle part of the pin. After the substrate is placed into the mold, a bottom-to-middle part of the pin and the substrate are located in the first cavity, and a middle-to-top part of the pin is located in the second cavity. The baffle structure on the pin is located at a joint between the first cavity and the second cavity, and the baffle structure abuts against a side wall at a top of the first cavity, to seal the first cavity. It may be understood that, when a middle-to-top part of one or more pins is located in one of second cavities, a baffle structure corresponding to the one or more pins is laid at a joint between the first cavity and the second cavity, to seal the first cavity. In an embodiment, the mold may be divided into two parts: an upper mold 801 and a lower mold 802 that are shown in FIG. 8. The soldered substrate may be first placed into the lower mold, and then mold clamping is performed, that is, the upper mold covers the lower mold, to form the first cavity and the at least one second cavity. It should be noted that the mold in FIG. 8 is merely an example for description. The second cavity may be sealed, or may be opened opposite to the first cavity. This may be adjusted according to an actual application scenario, and is not limited herein. In addition, a shape of the first cavity may be adjusted according to a shape of a package body that is actually needed. FIG. 8 is merely an example for description, and does not constitute a limitation.

603. Fill a liquefied plastic packaging material into the mold.

After the substrate to which the at least one pin is soldered is placed into the mold, the liquefied plastic packaging material is filled into the first cavity. After the plastic packaging material is solidified, the package body may be obtained. The package body includes the substrate, the pin, and the plastic packaging material, and further includes the chip, the electronic component, and others.

Figure 9:
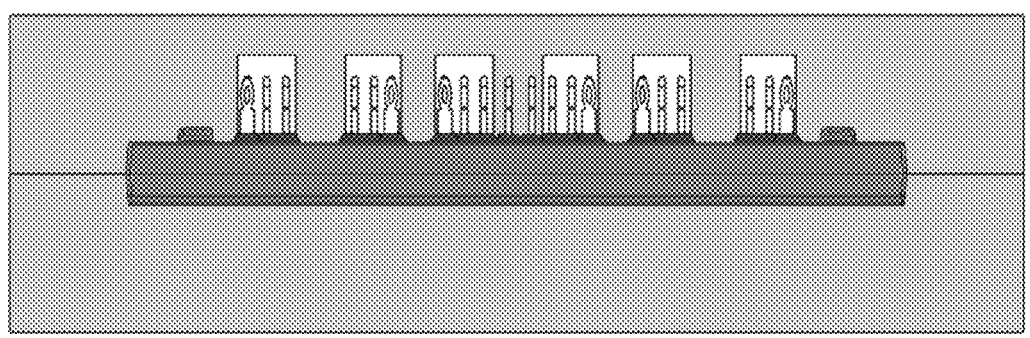
FIG. 9 is a schematic structural diagram after a plastic packaging material is filled according to an embodiment of the application.
Figure 10:
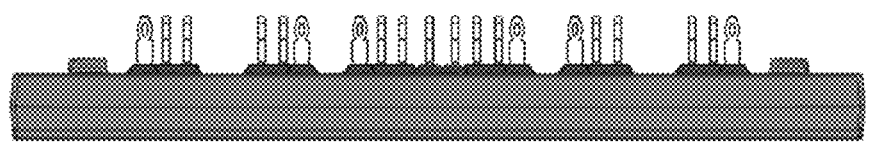
FIG. 10 is a schematic structural diagram of another package body according to an embodiment of the application.

For example, as shown in FIG. 9, the liquefied plastic packaging material is filled into the sealed first cavity formed by the mold and a cover plate structure. The baffle structure may seal the first cavity, to prevent the plastic packaging material from overflowing from the cavity that accommodates the plastic packaging material and that is in the mold. This prevents the plastic packaging material from flowing into the second cavity, and avoiding contamination of the pin or the mold. Generally, the plastic packaging material may be liquefied at a high temperature to form the liquefied plastic packaging material, and then filled into the first cavity. After the plastic packaging material is cooled, a solid may be formed. After the mold is removed, the package body may be obtained, as shown in FIG. 10.

In an embodiment of the application, after the mold clamping, the first cavity in the mold may be sealed by using the baffle structure carried on the pin. When the liquefied plastic packaging material is filled, overflow of the plastic packaging material from the cavity that accommodates the plastic packaging material and that is in the mold can be avoided. This avoids contamination of the mold and the pin. Compared with housing packaging and molding packaging, overflow of the plastic packaging material can be avoided. In addition, the pin may be led out from the top of the package body provided in an embodiment of the application, and a parasitic parameter is small. Compared with packaging in which a surface is provided with a hole and a pin is connected to a frame, any position at which the pin is soldered to the substrate can be flexibly determined, complex process steps of first packaging and then soldering are saved, and a problem such as adaptation between a filled plastic packaging material and an original solid plastic packaging material caused by the first plastic packaging and then soldering can be avoided. The pin is directly soldered to the substrate, so that a size of the package body can also be reduced. Therefore, in an embodiment of the application, contamination of the pin and the mold of the package body can be avoided, and the parasitic parameter and the size of the package body can be reduced.

The package body may be a common high-power module. Compared with conventional housing package, the method for manufacturing a package body provided in an embodiment of the application can improve reliability of the package body and has high manufacturing efficiency.

The foregoing embodiments are merely intended for describing the technical solutions of the application, but not for limiting the application. Although the application is described in detail with reference to the foregoing embodiments, one of ordinary skill in the art should understand that modifications to the technical solutions described in the foregoing embodiments or equivalent replacements to some technical features thereof can be made without departing from the scope of the technical solutions of embodiments of the application.

What is claimed is:

1. A pin for a package body, the pin comprising:
    a pin body, wherein a bottom of the pin body is soldered to a substrate of the package body; and a baffle structure, wherein the baffle structure is sleeved onto a middle of the pin body between a first part of the pin body and a second part of the pin body, the first part of the pin body comprising a top of the pin body and the second part of the pin body comprising the bottom of the pin body, and wherein the baffle structure is configured to prevent a plastic packaging material from contacting the first part of the pin body when the plastic packaging material is filled into a cavity in a mold to cover the substrate and at least a portion of the second part of the pin body.

2. The pin according to claim 1, wherein an angle between the baffle structure and the pin body along a direction of the bottom of the pin body is greater than 0 degrees, and is less than or equal to 90 degrees.

3. The pin according to claim 1, wherein the baffle structure is of a material capable of resisting a high temperature of over 175 degrees Celsius.

4. The pin according to claim 1, wherein the baffle structure is of an elastic material.

5. The pin according to claim 1, wherein the baffle structure and the middle of the pin body are integrally formed.

6. The pin according to claim 1, wherein a platform structure is disposed between the middle and the bottom of the pin body, and a width of an end of the platform structure that faces the middle of the pin body is greater than a width of the middle of the pin body.

7. The pin according to claim 1, wherein a curved structure is between the middle and the bottom of the pin body, and a slot is disposed in a middle of the curved structure.

8. The pin according to claim 1, wherein a flat connection structure is disposed between the middle of the pin body and the top of the pin body, and wherein
 a thickness of the connection structure is less than a threshold; or
 the connection structure is a rhombus structure, a slot is disposed in a middle of the connection structure, one of corners of the rhombus structure is connected to the top of the pin body, and an opposite corner is connected to the middle of the pin body.

9. The pin according to claim 1, wherein the bottom of the pin body is a bottom plate of a plate-shaped structure, and the bottom plate is soldered to the substrate.

10. A pin combination structure for a package body, comprising:
 at least two pins; and
 a baffle structure, wherein
 a bottom of each of the at least two pins is soldered to a substrate of the package body, and a plastic packaging material of the package body covers the substrate and wraps a bottom-to-middle part of each pin of the at least two pins;
 at least two slots are provided on the baffle structure, wherein each of the at least two slots of the baffle structure is sleeved on a middle of the each pin, and the at least two slots are in a one-to-one correspondence with the at least two pins; and
 wherein the baffle structure is configured to prevent the plastic packaging material from overflowing onto a middle-to-top part of each pin when the plastic packaging material is filled into a cavity in a mold for packaging the package body to accommodate bottom-to-middle parts of the at least two pins and the substrate, wherein the substrate is located at a bottom of the cavity, wherein middles of the at least two pins are located at a top of the cavity, a side wall at the top of the cavity abuts against the baffle structure, and a bottom-to-top height of the cavity is lower than a bottom-to-top height of the at least two pins.

11. A package body, comprising:
 a substrate;
 a plastic packaging material;
 a pin; and
 a baffle structure sleeved on the pin; wherein a bottom of a body of the pin is soldered to the substrate, the baffle structure is sleeved on a middle of the pin, and the plastic packaging material covers the substrate and wraps a bottom-to-middle part of the pin; and wherein the baffle structure is configured to prevent the plastic packaging material from overflowing onto a middle-to-top part of the pin when the plastic packaging material is filled into a cavity in a mold for packaging the package body to accommodate the bottom-to-middle part of the pin and the substrate, wherein the substrate is located at a bottom of the cavity, the middle of the body is located at a top of the cavity, a side wall at the top of the cavity abuts against the baffle structure, and a bottom-to-top height of the cavity is lower than a bottom-to-top height of the pin.

12. The package body according to claim 11, wherein an angle between the baffle structure and the pin along a direction of the bottom of the pin is greater than 0 degrees, and is less than or equal to 90 degrees.

13. The package body according to claim 11, wherein the baffle structure is of a material capable of resisting a high temperature of over 175 degrees Celsius.

14. The package body according to claim 11, wherein the baffle structure is of an elastic material.

15. The package body according to claim 11, wherein the baffle structure and the middle of the pin are integrally formed.

* * * * *